(12) United States Patent
Werner et al.

(10) Patent No.: US 7,972,541 B2
(45) Date of Patent: Jul. 5, 2011

(54) DOPED ORGANIC SEMICONDUCTOR MATERIAL

(75) Inventors: Ansgar Werner, Dresden (DE); Andrea Lux, Dresden (DE); Josef Salbeck, Kaufungen (DE)

(73) Assignee: Novaled AG, Dresden (DE)

( * ) Notice: Subject to any disclaimer, the term of this patent is extended or adjusted under 35 U.S.C. 154(b) by 357 days.

(21) Appl. No.: 12/093,167

(22) PCT Filed: Nov. 10, 2006

(86) PCT No.: PCT/EP2006/010816
§ 371 (c)(1),
(2), (4) Date: Jul. 21, 2008

(87) PCT Pub. No.: WO2007/054345
PCT Pub. Date: May 18, 2007

(65) Prior Publication Data
US 2009/0001327 A1    Jan. 1, 2009

(30) Foreign Application Priority Data
Nov. 10, 2005   (EP) .................................... 05024515

(51) Int. Cl.
*H01L 29/08* (2006.01)
*H01L 33/00* (2010.01)
*H01B 1/12* (2006.01)
*B32B 9/06* (2006.01)

(52) U.S. Cl. ....... 252/519.2; 428/690; 257/40; 257/102; 257/103

(58) Field of Classification Search .................... 257/40, 257/102, 103; 252/519.2; 428/690
See application file for complete search history.

(56) References Cited

U.S. PATENT DOCUMENTS

| | | | |
|---|---|---|---|
| 2,566,208 | A | 8/1951 | Jenkins |
| 3,083,242 | A | 3/1963 | Ramsden |
| 3,226,450 | A | 12/1965 | Blazejak |
| 3,558,671 | A | 1/1971 | Martin |
| 3,563,751 | A | 2/1971 | Cohen |
| 4,003,943 | A | 1/1977 | Fukunaga |
| 4,066,569 | A | 1/1978 | Lim |
| 4,133,821 | A | 1/1979 | West et al. |
| 4,618,453 | A | 10/1986 | Kim |
| 4,960,916 | A | 10/1990 | Pazik et al. |
| 5,093,698 | A | 3/1992 | Egusa |

(Continued)

FOREIGN PATENT DOCUMENTS

CA    2549309    9/2005

(Continued)

OTHER PUBLICATIONS

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

(Continued)

*Primary Examiner* — Mark Kopec
*Assistant Examiner* — Jaison P Thomas
(74) *Attorney, Agent, or Firm* — Sutherland, Asbill & Brennan, LLP (57) ABSTRACT

The present invention relates to a doped organic semiconductor material comprising at least one organic matrix material, which is doped with at least one dopant, the matrix material being selected from a group consisting of certain phenanthroline derivatives; and also an organic light-emitting diode which comprises such a semiconductor material.

29 Claims, 2 Drawing Sheets

U.S. PATENT DOCUMENTS

| | | | |
|---|---|---|---|
| 5,110,835 A | 5/1992 | Walter et al. | |
| 5,247,226 A | 9/1993 | Sato et al. | |
| 5,281,730 A | 1/1994 | Zambounis et al. | |
| 5,292,881 A | 3/1994 | Berneth et al. | |
| 5,393,614 A | 2/1995 | Nakada | |
| 5,556,524 A | 9/1996 | Albers | |
| 5,811,833 A | 9/1998 | Thompson | |
| 5,840,217 A | 11/1998 | Lupo et al. | |
| 5,922,396 A | 7/1999 | Thompson et al. | |
| 6,013,384 A * | 1/2000 | Kido et al. | 428/690 |
| 6,013,982 A | 1/2000 | Thompson et al. | |
| 6,103,459 A | 8/2000 | Diel et al. | |
| 6,207,835 B1 | 3/2001 | Reiffenrath et al. | |
| 6,350,534 B1 | 2/2002 | Boerner et al. | |
| 6,423,429 B2 | 7/2002 | Kido et al. | |
| 6,451,415 B1 * | 9/2002 | Forrest et al. | 428/212 |
| 6,524,728 B1 | 2/2003 | Kijima et al. | |
| 6,700,058 B2 | 3/2004 | Nelles et al. | |
| 6,747,287 B1 | 6/2004 | Toguchi et al. | |
| 6,824,890 B2 | 11/2004 | Bazan et al. | |
| 6,908,783 B1 | 6/2005 | Kuehl et al. | |
| 6,972,334 B1 | 12/2005 | Shibanuma et al. | |
| 7,081,550 B2 | 7/2006 | Hosokawa et al. | |
| 7,345,300 B2 | 3/2008 | Qin | |
| 2003/0064248 A1 | 4/2003 | Wolk | |
| 2003/0165715 A1 | 9/2003 | Yoon et al. | |
| 2003/0234397 A1 | 12/2003 | Schmid et al. | |
| 2004/0068115 A1 | 4/2004 | Lecloux et al. | |
| 2004/0076853 A1 | 4/2004 | Jarikov et al. | |
| 2005/0040390 A1 | 2/2005 | Pfeiffer et al. | |
| 2005/0061232 A1 | 3/2005 | Werner et al. | |
| 2005/0072971 A1 | 4/2005 | Marrocco et al. | |
| 2005/0086251 A1 | 4/2005 | Hatscher et al. | |
| 2005/0110009 A1 | 5/2005 | Blochwitz-Nimoth et al. | |
| 2005/0121667 A1 | 6/2005 | Kuehl et al. | |
| 2005/0123793 A1 * | 6/2005 | Thompson et al. | 428/690 |
| 2005/0231100 A1 | 10/2005 | Elliott et al. | |
| 2006/0049397 A1 | 3/2006 | Pfeiffer et al. | |
| 2006/0138453 A1 * | 6/2006 | Thompson et al. | 257/183 |
| 2006/0204073 A1 * | 9/2006 | Conley et al. | 428/690 |
| 2007/0026257 A1 | 2/2007 | Begley et al. | |
| 2007/0058426 A1 | 3/2007 | Sokolik et al. | |
| 2007/0252140 A1 | 3/2007 | Limmert et al. | |
| 2007/0090371 A1 | 4/2007 | Drechsel et al. | |
| 2007/0116984 A1 | 5/2007 | Park et al. | |
| 2007/0145355 A1 | 6/2007 | Werner et al. | |
| 2008/0103315 A1 | 5/2008 | Egawa et al. | |
| 2008/0122345 A1 | 5/2008 | Sakata et al. | |
| 2008/0145708 A1 | 6/2008 | Heil et al. | |
| 2008/0265216 A1 | 10/2008 | Hartmann et al. | |

FOREIGN PATENT DOCUMENTS

| | | |
|---|---|---|
| CH | 354065 | 5/1961 |
| CH | 354066 | 5/1961 |
| DE | 19836408 | 2/2000 |
| DE | 10261662 | 7/2004 |
| EP | 1000998 | 5/2000 |
| JP | 61254582 | 11/1986 |
| JP | 63172274 | 7/1988 |
| JP | 63172275 | 7/1988 |
| JP | 04338760 | 11/1992 |
| JP | 7168377 | 7/1995 |
| JP | 2004010703 | 1/2004 |
| JP | 2004335557 | 11/2004 |
| WO | 03088271 | 10/2003 |
| WO | WO 03088271 * | 10/2003 |
| WO | WO 03/104237 | 12/2003 |
| WO | 2005086251 | 9/2005 |
| WO | WO 2005086251 * | 9/2005 |
| WO | WO 2006/067800 | 6/2006 |
| WO | WO 2008/022633 | 2/2008 |

OTHER PUBLICATIONS

Akutagawa., T. et al. "Multi Electron and Proton-Transfer System Based on 2,2'-biimidazole derivatives," Science and Technology of Syn. Metals, 1994, 346.

Alonso, R. A. et al. "Photostimulated Reaction of Diphenylarsenide and Diphenylstibide Ions with Haloaromatic Compounds by the Srn1 Mechanism. Electron Transfer vs. Bond Breaking of the Radical Anion Intermediate," J. Org. Chem. (1982) 47(1) pp. 77-80.

Auch et al. "Eine neue Synthese und die Kristallstrukturanalyse von., Krokonat-Blau . . . ," Chem. Ber. 120, 1691-1696 (1987), extract, pp. 1691-1693, 6 total pages.

Bach, U. et al. "Solid-state dye-sensitized mesoporous $TiO_2$ solar cells with high photon-to-electron conversion efficiencies," Nature, vol. 395, Oct. 8, 1998, pp. 583-585.

Bamgboye, T.T. et a. "Lewis acidity of $Ph_2SbX_3$, wherein X = Cl or Br. Crystal structures of $Ph_2SbCl_3*H_2O$ and $Ph_2SbBr_3*MeCN$," J. of Organometallic Chem. vol. 362, Feb. 28, 1989, pp. 77-85.

Barton, D.H.R. et al. "Comparative Arylation Reactions with Pentaphenylbismuth and with Triphenylbismuth Carbonate," J. Chem. Soc. Chem. Commun. (1980) 17, pp. 827-829.

Baumgartel, H. et al., "Polarographische Untersuchungen zur Konformation von 1.2.3.4.5-pentaarylimidazoliumkationen," Ber. Bunsenges (1972) 76/2, 94-100.

Baumgartel, H. et al., "Uber eine neue Synthese von tetraaryl-imidazolen und pentaaryl-imidazolium-salzen," Chem. Ber. (1968), 101, 3504.

Bhattacharya, S.N. et al. "Preparation & Characterization of Some Triarylarsenic & Triarylantimony Mixed Halides & Related Compounds," Indian J. Chem. 16A (1978) pp. 778-781.

Blinka et al. "Octacyanotetramethylenecyclobutane Dianioin and its Anion-Radical," Tetrahedron Lett. (1983). vol. 24, No. 1567-1568.

Blochwitz, J., et al., "Low voltage organic light emitting diodes featuring doped phthalocyanine as hole transport material," Applied Physics Letters, vol. 73, No. 6, Aug. 10, 1998, pp. 729-731.

Bonati, F. et al. "Reactions of C-imidazolyllithium derivatives with Broup Ib compounds: tris[micro-(1-alkylimidazolato-N3, C2)]trigold (I) and -silver (I)," J. Organomet. Chem. 1989, 375, pp. 147-160.

Brucsis, L. et al. "Substituionasreaktionen an 1,4-dihalogen-2,3,5,6-tetracyan-benzolen," Chem. Ber. 109(1976) pp. 2469-2474.

Cherkashin M. I. et al. "Studies on 2,4,5-triarylimidazoles," Izv. Akad. Nauk SSSR, Seriya Khim. 1982, 2, pp. 376-377.

Chonan et al. "The synthesis of difluoro and dimethyl derivatives of 2,6-bis(dicyanomethylene)-2,6-dihydro-4H-cyclopenta[2, 1-b:3,4-b']-dithiophen-4-one (CPDT-TCNQ) and the Conducting Properties of the Metallic Salts Based on the Dimethy Derivative," The Chemical Society of Japan (2004) pp. 1487-1497.

Curini, M. et al., "Ytterbium Triflate Promoted Synthesis of Benzimidazole Derivatives," Synlett, No. 10, pp. 1832-1834, 2004.

Dedik, S.G. et al. "Tetrahalotetraazafulvalenes—new strong electron acceptors," Chemistry of Heterocyclic Compounds (A Translation of Khimiyageterotsiklicheskikh Soedinenii), Plenum Press Co., New York, U.S., vol. 10, Jan. 1, 1989, p. 1421.

Deluca, Mark et al., "The p-toluenesulfonic acid promoted synthesis of 2-substituted benzoxazoles and benzimidazoles from diacylated precursors," Tetrahedron, vol. 53, No. 2, pp. 457-464, 1997.

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Fatiadi et al. "Electrochemical Oxidation of Several Oxocarbon Salts in N,N-dimethylformamide," J. Electroanalytical Chem. (1982) vol. 135, pp. 193-209.

Fatiadi, "Psuedooxocarbons, Synthesis of 1,2,3-tris(dicyanomethylene)croconate Salts; A New Bond-Delocalized Dianion, Croconate Blue," J. Org. Chem. 1980, 45, 1338-1339.

Fatiadi, "Synthesis of 1,3-(dicyanomethylene)croconate Salts. New Bond-Delocalized Dianion, Croconate Violet," Journal of the American Chemical Society, Apr. 12, 1978, pp. 2586-2587.

Fausett, B.W. et al, "Palladium-catalyzed coupling of thiol esters with aryl and primary and secondary alkyl organiindium reagents," J. Org. Chem. (2005) 70(12) pp. 4851-4853.

Fenghong Li et al., "Leuco Crystal Violet as a dopant for n-doping of organic thin films of fullerene C60," J. Phys. Chem. B 2004, 108, pp. 17076-17088.

Fild, Manfred et al. "Group VA pentafluorophenyl compounds. 14. Pentafluorophenyl-substituted phosphoranes," Zeitschrift Fuer Anorganische und Allgemeine Chemie, 439, pp. 145-152 (1978).

Fukunaga, T. et al. "Negatively substituted trimethylenecyclopropane dianions," J. Am. Chem. Soc., 1976, pp. 610-613.
Gan, F. "Optical nonlinearity of hybrid and nanocomposite materials prepared by the Sol-Gel method," J. of Sol-Gel Science and Technology, 13, 559-563 (1998).
Ganzorig, C. et al., "p-Typed Semiconducts of Aromatic Diamines Doped with SbCl5," Chemistry Letters 2000, pp. 1032-1033.
Gibbons, M.N. et al. "Multiply Bridged Diantimony Compounds," Phosphorus, Sulfur, & Silicon 93/94 (1994).
Giovanella, et al. "Electroluminescence from two fluorinated organic emitters embedded in polyvinyl carbazole," Applied Physics Letters, vol. 87, pp. 171910-1-171910-3.
Glemser, O. et al. "Synthese von Tris-pentafluorphenylarsin, -stibin und -phosphin sowie von Trimethyl-pentafluor-phenylsilan," Angew. Chemie (1964) 76, 953.
Gogoi, P. et al. "An efficient and one-pot synthesis of imidazolines and benzimidazoles via anaerobic oxidation of carbon-nitrogen bonds in water," Tetrahedron Lett. 2006, 47, pp. 79-82.
Gregg, B.A. et al., "On the superlinear increase in conductivity with dopant concentration in excitonic semiconductors," Applied Physics Letters, vol. 84, No. 10, Mar. 8, 2004, pp. 1707-1709.
Grimmett, M. R., "Imidazole and benzimidazole synthesis," Tables of Contents, pp. 1-10, Academic Press, Harcourt Brace & Company, Publishers, London, San Diego, NY, Boston et al., 1997.
Haddon, R.C. et al., "Conducting films of C60 and C70 by alkali-metal doping," Nature, vol. 350, Mar. 28, 1991, pp. 320-322.
Harada, Kentaro et al., "Realization of organic pn-homojunction using a novel n-type doping technique, Proceedings of SPIE—The international Society for Optical Engineering; Organic Optoelectronics and Photonics 2004," vol. 5464, Sep. 2004, pp. 1-9.
Harris, G. S. et al."The Reaction of Trispentafluorophenylstibine with Halogens and Interhalogens," J. Fluorine Chem. 37 (1987) pp. 247-252.
Heinze, J. et al., "Polarographic studies of the conformation of 1,2,3,4,5-pentaarylimidazolium cations," The Institute for Physical Chemistry at the University of Freiburg, pp. 1-22, 1972.
Hill, J. "Oxidative Dimerization of Benzimidazole," J. Org. Chem. 1963, 28, pp. 1931-1932.
Hopf et al. "Uber einen neuen Kohlenwasserstoff C18H24 . . . ," Helvetica Chimica Acta, vol. XLIV, Issue II (1961), No. 46, extract from p. 380-386.
Hopf et al., "Preparation and Properties, Reactions, and Applications of Radialenes," Angewandte Chemie, vol. 31, No. 8, Aug. 1992, pp. 931-954.
Iyoda, et al. "Novel synthesis of hexaaryl[3]radialenes via dibromo[3]dendralenes," Tetrahedron Letters 41 (2000), 6 pgs.
Japp, F. et al. "Constitution of Glycosine," J. Chem. Soc. Trans. 1887, 51, pp. 552-557.
Jefferson, Alan M. and Suschitzky, H., "New Route to Nucleophillically Substituted o-phenylenediamines," J.C.S. Chem. Comm. pp. 189-190, 1997.
Jensen, W.B.; The Generalized Lewis Acid Based Concepts, John Wiley & Sons, New York, 1980, pp. 113-195.
Ji, L. et al. "Mono- , di- and tetra-nuclear ruthenium (II) complexes containing 2,2'-p-phenylenebis(imidazo[4,5-f]phenanthroline): synthesis, characterization and third-order non-linear optical properties," J. Chem. Soc., Dalton Trans. 2001, pp. 1920-1926.
Katz, H.E. et al., "Pyridyl Dicyanoquinodimethane Acceptors for Electroactive Solids," J. Org. Chem. 56 (1991) pp. 5318-5324.
Kaufhold, Von Jurgen et al., "Uber das Leitfahigkeitsverhalten verschiedener Phthalocyanine im Vakuum und unter dem Einfluss von gasen," Ber. Bunsen. Phys. Chem. 69, pp. 168-179.
Kikuchi, A et al. "A new family of pi-conjugated delocalized biradicals: electronic structures of 1,4-bis(2,5-diphenylimidazol-4-ylidene)cyclohexa-2,5-diene," J. Phys. Chem. B., 2005, 109, pp. 19448-19453.
Kikuchi, A. et al. "Definitive Evidence for the Contribution of Biradical Character in a Closed-Shell Molecule, Derivative of 1,4-Bis-(4,5-diphenylimidazol-2-ylidene)cyclohexa-2,5-diene," J. Am. Chem. Soc. 2004, 126, pp. 6526-6527.
Kimura, M. et al. "Preparation of 4-(4,5-diphenyl-1H-imidazol-2-yl)benzaldehyde and Its Practical Synthetic Use in the Synthesis of Unsymmetrically Substituted Imidazoles," ITE Letters on Batteries, New Technologies and Medicine, 2002, 3, pp. 30-34.
Klopman, G. "Chemical Reactivity and the Concept of Charge-and Frontier-controlled reactions," Journal of the American Chemical Society, vol. 90, No. 2, Jan. 17, 1968, pp. 223-234.
Koster, et al. "Synthesis and reactions of a tetraquinocyclobutane," Dept. of Chemistry, Univ. of Wisconsin, J. Org. Chem., vol. 40, No. 16, 1975, pp. 2300-2304.
Kozaki, M. et al. "Preparation, Properties, and Reduction of Heteroaromatic Quinoids with 1,4-diazacyclopentadien-2-ylidene Terminals," Org. Lett. 2005, 7, pp. 115-118.
Krebs, F.C. et al. "Superradiant properties of 4,4'-bis(1H-phenanthro[9,10-d]imidazol-2-yl)biphenyl and how a laser dye with exceptional stability can be obtained in only one synthetic step," Tetrahedron Lett. 2001, 42, pp. 6753-6757.
Kulkarni, A.P. et al., "Electron transport materials for organic light-emitting diodes," Chem. Mater. 2004, 16, pp. 4556-4573.
Lane, E.S. "A Modified Benziminazole Synthesis," J. Chem. Soc. 1953, pp. 2238-2240.
Lehmstaedt, K. et al. "Halogen-2,2'-diimidazole und ihre Umsetzungen mit Aminen zu Farbstoffen," Ber. Dt. Chem. Ges. B, 1943, pp. 879-891.
Leyden, R. et al. "Thermally Induced Degradation of 2,3,5,6-tetrachloroterephthalylidenebis(o-aminoaniline)," J. Org. Chem. 1983, 48, pp. 727-731.
Li, J. Y. et al. "Enhancement of green electroluminescence from 2,5-di-p-anisyl-isobenzofuran by double-layer doping strategy," Preparation and Characterization, vol. 446, No. 1, pp. 111-116.
Ludvik, J. and Pragst, F. et al., "Electrochemical generation of triplet states," Journal of Electroanalytical Chemistry, No. 180, pp. 141-156, (1984).
Ludvik, J. and Volke, J. "Evidence for a radical intermediate in the anodic oxidation of reduced nicotinamide adenine dinucleotides obtained by electrogenerated chemiluminescence," Analytica Chimica Acta, 209 (1988) 69-78.
Maennig, B. et al., "Organic p-i-n solar cells," App. Phys. 2004, A 79, pp. 1-14.
Matschke, M. et al. "Bis-4h-imidazoles-tetraazafulvalenes-2,2'-biimidazoles: three variations of one redox system," Tetrahedron, vol. 62, No. 36, Sep. 4, 2006, pp. 8586-8590.
Mayer, U. et al. "Uber 2,3,6,7-tetraphenyl-1,4,5,8-tetraazafulvalen," Tetrahedron Lett. 1966, 42, pp. 5221-5223.
Mayer, U. et al. "Uber Biradikale, Chinone und Semichinone der Imidazolyl-Reihe," Angew. Chem. 1966, 78, p. 303.
Minoura, M. et al. "Hexaaryltellurium, the First Neutral Compounds Comprising Hexaarylated Elements," Angew. Chem. Int. Edit. 35 (22) pp. 2660-2662 (1996).
Miyasato, M. et al. "Syntheses and Reactions of Hexavalent Organitellurium Compounds Bearing Five or Six Tellurium-Carbon Bonds," Chem.-A European J. 10(10) pp. 2590-2600 (2004).
Muramatsu, T. et al, "Visible Light Sensitive Cyclomer and Its Tautomeric Dispiro Compound Formed from Bispyridiny Diradical," J. Am. Chem. Soc. 2005, 127, 4572-3.
Muramatsu, T. et al., "Photosensitive Cyclomer Formation of 1,1'-(1,2-ethanediyl)bis(pyridinyl) diradical and its derivativese," J. Am. Chem. Soc. 1989, 111, 5782-7.
Muramatsu, T. et al., "Preparation and Properties of a novel heterocyclic dispiro compound, 3, 10-diaza-N,N-dimethyldispiro[5.0.5.3]pentadeca-1,4,8,11-tetraene," Chemistry Letters, pp. 151-152, (1996).
Nelsen, Stephen, F.; "Heterocyclic Radical Anions. II. Naphthalic and 1,4,5,8-Naphthalenetetracarboxylic Acid Derivatives," Journal of the American Chemical Society, 89:23, Nov. 8, 1967, pp. 5925-5931.
Oeter, D. et. al., "Doping and Stability of Ultrapure alpha-oligothiophene Thin Films," Synthetic Metals, 61, 1993, pp. 147-150.
Okada, K. et al. "Detection of a diradical intermediate in the cis-trans isomerization of 5,5'-bis(4,5-diphenyl-2H-imidazol-2-ylidene)-5,5'-dihydro-delta 2,2'-bithiophene," Tetrahedron Lett. 2006, 47, pp. 5375-5378.
Okada, K. et al. "Novel Dimers of 2,2'-(m-Phenylene)bis(4,5-diphenyl-1-imidazolyl) Diradical," Chem. Lett. 1998, pp. 891-892.

Otero, A. et a. "Pentachlorophenyl-arsenic, -antimony and -bismuth compounds," J. of Organometallic Chemistry, vol. 171, No. 3, Jan. 1, 1979, pp. 333-336.

Otero, A. et al. "Pentafluorophenylantimony compounds," J. Organometallic Chem. 154 (1978) pp. 13-19.

Ouchi, A. et al. "13C-nuclear magnetic resonance of some triaryl- and tri-alkylantimony and -bismuth derivatives," J. of Inorganic and Nuclear Chemistry, vol. 37, Issue 11, Nov. 1975, pp. 2347-2349.

Ouchi, A. et al. "The syntheses and properties of some alkylthioacetato and arylthioacetato derivatives of triphenylantimony(V) and -bismus (V)," J. of Inorganic and Nuclear Chemistry, vol. 37, Issue 12, Dec. 1975, pp. 2559-2561.

Park, S. B. et al, "Highly Efficient, Recyclable Pd(II) Catalysts with Bisimidazole Ligands for the Heck Reaction in Ionic Liquids," Organic Lett. 2003, 5, pp. 3209-3212.

Parthasarathy, G. et al., "Lithium doping of semiconducting organic charge transport materials," J. Appl. Phys., vol. 89, No. 9, May 1, 2001, pp. 4986-4992.

Petzhold, C. "Beitrage zur Synthese funktioneller 1,4,5,8-tetraazafulvalene," Dissertation, Friedrich-Schiller-Universitat Jena; 2006.

Pfeiffer, M. et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Quast, H. and Schmitt, E.; "Note Regarding the Quaternization of Heterocycles," Institute of Organic Chemistry at the University of Wurzburg, Chem. Ber. 101, pp. 4012-4014, (1968).

Rake, A. T. et al. "Pentafluorophenyl and phenyl-phosphinidene ions and their group V analogues" Oms. Organic Mass Spectrometry, vol. 3 Jan. 1, 1970, pp. 237-238.

Rasmussen, P.G. et al. "Complexes of the New Ligand Tetracyanobiimidazole," J. Am. Chem. Soc. 1982, 104, pp. 6155-6156.

Rezende, M. C. et al. "An Alternative Preparation of Bisbenzimidazoles," Syn. Comm. 2001, 31, pp. 607-613.

Rezende, M. et al. "Puzzling Formation of Bisimidazole Derivatives from Hexachloroacetone and Diamines," Tetrahedron Lett. 1996, 37, 5265-5268.

Sakaino, Y. "Structures and Chromotropic Properties of 1,4-bis(4,5-diphenylimidazol-2-yl)benzene Derivatives," J. Org. Chem. 1979, 44, pp. 1241-1244.

Sato, S. et al. "Isolation and Molecular Structure of the Organopersulfuranes [12-S-6(C6)]," J. Am. Chem. Soc. 128(21) pp. 6778-6779 (2006).

Schmidt, "Reaktionen von Quadratsaure und Quadratsaure-Derivaten," Synthesis, Dec. 1980, extract pp. 966, 24 total pages.

Schneiders, P. et al. "Notiz zur Darstellung von 4,4',5,5'-tetrasubstituierten Di-2-imidazolyl-derivaten. Ausgangsprodukte zur Darstellung von 1,4,5,8-tetraazafulvalenen," Chem. Ber. 1973, 106, pp. 2415-2417.

Schwarz, W. M. et al., "Formation of Stable Free Radicals on Electroreduction of N-alkylpyridium salts," J. Am. Chem. Soc., 33 3164 (1961).

Seitz, G., Nachr. Chem. Tech. Lab 28 (1980), No. 11, extract pp. 804-807, total pages; 6: "Pseudooxokohlenstoffe."

Sekine, T. et al. "Dimerizations of pi-Rich N-heteroaromatic compounds and xanthine derivatives," Chem. Pham. Bull. 1989, 37, pp. 1987-1989.

Sharma, G.D. et al., "Influence of Iodine on the Electrical and Photoelectrical Properties of Zinc Phthalocyanine Think Film Devices," Materials Science and Engineering, B41, 1996, pp. 222-227.

Singhal, K. et al, "One the Lewis acidity of tris(pentafluorophenyl)antimony (V) dichloride towards neutral modentate O, N and S donor ligands," Journal of Fluorine Chemistry, vol. 121, No. 2, Jun. 1, 2003, pp. 131-134.

Smith, M.B. Organic Synthesis, McGraw-Hill, Inc. 1994, Chapter 1.

Sprenger, et al. "The cyclobutenediylium cation, a novel chromophore from squaric acid," Angew. Chem. International Edition, vol. 6 (1967), No. 6, pp. 553-554.

Suschitzky, H. "Syntheses and Reactions of 2,2'-bisbenzimidazole Systems," J. Heterocyclic Chem. 1999, 36, pp. 1001-1012.

Suzuki, T. et al., "4,7-bis(dimethylamino)benzimidazoles and twin-type derivatives: reversible two-stage redox system modulated by proton-transfer," Tetrahedron Lett. 2003, 44, pp. 7881-7884.

Takahashi et al. "Novel Electron Acceptors for Organic Condcutors: 1,2-Bis(p-benzoquino)-3-[2-(dicyanomethylene)-2,5-thienoquino]cyclopropane Derivatives," J. Chem. Soc., Chem. Commun., 1994, pp. 519-520.

Takahashi et al. "Novel metallic charge-transfer complexes composed of a [3]radialene type acceptor: a 1,2-bis(p-benzoquino)-3-[2-(dicyanomethylene) . . . " Advanced Materials, July, No. 7, 3 pgs.

Vaid T.P. et al, "Investigations of the 9,10-diphenylacridyl radical as an isostructural dopant for the molecular semiconductor 9, 10-diphenylanthracene," Chemistry of Materials, American Chemical Society, Bd. 15, Nr. 22, 4292-4299 (2003).

Vyas, P.C. et al. "A simple synthesis of 2,2'-bis-benzimidazoles," Chem. Industry, 1980, pp. 287-288.

Weiss, M. "Acetic Acid-Ammonium Acetate Reactions. 2-Isoimidazoles as Intermediates in Imidazole Formation," J. Am. Chem. Soc. 1952, 74, pp. 5193-5195.

West, R. et al., "Diquinocyclopropanones, Diquinoethylenes, and the Anion-Radical and Free-Radical Intermediates in their Formation," Dept. of Chemistry, Univ. of Wisconsin, Feb. 24, 1975, pp. 2295-2799.

Wintgens, V. et al., "Reduction of Pyrylium Salts: Study by ESR and UV_Visible Spectroscopy of the Reversible Dimerization of the Pyranyl Radical," New. J. Chem., 10/6, 345-350 (1986).

Yamaguchi, et al., "New Approaches to Tetracyanoquinodimethane," Bull. Chem. Soc. Jpn. 62 (1989) pp. 3036-3037.

Yamamoto, Y. et al. "The Electrical Properties of the Poly(N-vinyl Carbazole)-Antimony (V) Chloride (or Iodine) Charge Transfer Complexes," Bull. Chem. Soc. Jap. 1965,38, 2015-2017.

Yoshiko, S., et al. "The Quinoid-biradical Tautomerism of 3,6-bis(4,5-diphenyl-2H-imidazol-2-ylidene)-1,4-cyclohexadiene," Nippon Kagaku Kaishi, 1972, 1, pp. 100-103.

Yukihiko, T., et al. "Studies on Aromatic Nitro Compounds. V. A Simple One-Pot Preparation of o-Aminoaroylnitriles from Some Aromatic Nitro Compounds," Chem. Pharm. Bull., 33 (4) 1360-1366 (1985).

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Ziegenbein, W. "The cyclobutenediylium cation, a novel chromophore from squaric acid," Angew. Chem., 79:12, pp. 581-582 (1967).

Zimmerman, T. et al. "Benzocycloalkenone and dihydro-2H, 7H-1-benzopyranone aus 2,4,6-triaryl-pyryliumsalzen und cycloalkan-1,2-dionen," J. Prakt. Chem. 331 pp. 306-318 (1989).

English Translation of Japanese Office Action; Japanese Patent Application No. 2005-228491; Apr. 17, 2009.

Final Office Action, U.S. Appl. No. 11/688,777; Nov. 27, 2009.
Non-Final Office Action, U.S. Appl. No. 11/688,777; Feb. 2, 2009.
Response to Office Action, U.S. Appl. No. 11/688,777; Sep. 4, 2009.
Response to Office Action, U.S. Appl. No. 11/688,777; Aug. 3, 2009.
Restriction Requirement, U.S. Appl. No. 11/688,777; Mar. 5, 2010.
Response to Restriction Requirement, U.S. Appl. No. 11/688,777; Apr. 1, 2010.
Notice of Allowance, U.S. Appl. No. 11/196,491; Apr. 13, 2009.
Notice of Allowance, U.S. Appl. No. 11/196,491; Oct. 20, 2008.
Response to Office Action for U.S. Appl. No. 11/196,491; Aug. 11, 2008.
Final Office Action, U.S. Appl. No. 11/196,491; Feb. 11, 2008.
Response to Office Action for U.S. Appl. No. 11/196,491; Nov. 5, 2008.
Non-Final Office Action, U.S. Appl. No. 11/196,491; Jul. 3, 2007.
Advisory Action for U.S. Appl. No. 11/315,072 mailed Mar. 8, 2010.
Response to Final Office Action for U.S. Appl. No. 11/315,072; Feb. 17, 2010.
Final Rejection for U.S. Appl. No. 11/315,072; Nov. 16, 2009.
Response to Office Action for U.S. Appl. No. 11/315,072; Jul. 29, 2009.
Non-Final Rejection for U.S. Appl. No. 11/315,072; Apr. 29, 2009.
Non-Final Rejection for U.S. Appl. No. 11/315,072; Nov. 12, 2008.

Response to Office Action for U.S. Appl. No. 11/315,072; Feb. 10, 2009.
European Search Report for EP 07009366; Oct. 19, 2007.
Non-Final Rejection for U.S. Appl. No. 12/046,620; Nov. 25, 2009.
Response to Restriction Requirement for U.S. Appl. No. 12/046,620; Aug. 24, 2009.
Restriction Requirement for U.S. Appl. No. 12/046,620; Jul. 22, 2009.
C.W. Tang et al., "Organic electroluminescent diodes", Appl. Phys. Lett. 51 (12), pp. 913-915 (1987).
X. Zhou et al., "Very-low-operating-voltage organic light-emitting diodes using a p-doped amorphus hole injection layer", Appl. Phys. Lett., 78 (4), pp. 410-412 (2001).
J. Kido et al., "Bright organic electroluminescent devices having a metal-doped electron-injecting layer", Appl. Phys. Lett. 73, pp. 2866-2868 (1998).
M. Maitrot et al., "Molecular material based junctions: Formation of a Schottky contact with metallophthalocyanine thin films doped by the cosublimation method", J. Appl. Phys., 60 (7), pp. 2396-2400 (1986).
K. Harada et al., "Organic Homojunction Diodes with a High Built-in Potential: Interpretation of the Current-Voltage Characteristics by a Generalized Einstein Relation", Phys. Rev. Lett. 94, pp. 036601-1 to 036601-4, (2005).
J.-S. Huang et al., "Low-voltage organic electroluminescent devices using pin structures" Appl. Phys. Lett., 80 (1), pp. 139-141 (2002).
R. Schlaf et al., "HOMO/LUMO Alignment at PTCDA/ZnPc and PTCDA/ClInPC Hererointerfaces Determined by Combined UPS and XPS Measurements", J. Phys. Chem. B 103, pp. 2984-2992 (1999).
W. Gao et al., "Effect of electrical doping on molecular level alignment at organic-organic heterojunctions", Appl. Phys. Lett. 82, pp. 4815-4817 (2003).

J.D. Anderson, "Electrochemistry and Electrogenerated Chemiluminescence Processes of the Components of Aluminum Quinolate/Triarylamine, and Related Organic Light-Emitting Diodes", J. Amer. Chem. Soc. 120, pp. 9646-9655 (1998).
B.W. D'Andrade et al., "Relationship between the ionization and oxidation potentials of molecular organic semiconductors", Org. Electron. 6, pp. 11-20 (2005).
A.J. Bard and L.R. Faulkner, "Electrochemical Methods: Fundamentals and Applications", Wiley, 2nd Edition 2000.
Y. Fu et al., "Quantum-Chemical Predictions of Absolute Standard Redox Potentials of Diverse Organic Molecules and Free Radicals in Acetonitrile", J. Am. Chem. Soc., 127, pp. 7227-7234 (2005).
Gufeng He et al., "High-efficiency and low-voltage p-i-n electrophosphorescent OLEDs with double-doping emission layers", Proceedings of the SPIE, 5464 (1), pp. 26-31 (2004).
T.B. Tang, "Ionization thresholds of merocyanine dyes in the solid state", J. Appl. Phys. 59, pp. 5-10 (1986).
M. Pfeiffer et al., "Controlled doping of phthalocyanine layers by cosublimation with acceptor molecules: A systematic Seebeck and conductivity study", Appl. Phys. Lett., 73 (22) pp. 3202-3204 (1998).
A. Nollau et al., "Controlled n-type doping of a molecular organic semiconductor: Naphthalenetetracarboxylic dianhydride (NTCDA) doped with bis(ehtylenedithio)-tetrathiafulvalene (BEDT-TTF)", J. Appl. Phys., 87 (9), pp. 4340-4343 (2000).
V.D. Parker, "On the Problem of Assigning Values to Energy Changes of Electrode Reactions", J. Amer. Chem. Soc. 96, pp. 5656-5661 (1974).
L.L. Miller et al., "A Simple, Comprehensive Correlation of Organic Oxidation and Ionization Potentials", J. Org. Chem. 37, pp. 916-918 (1972).
A.G. Werner et al., "Pyronin B as a donor for n-type doping of organic thin films", Appl. Phys. Lett., 82 (25) pp. 4495-4497 (2003).

* cited by examiner

DOPED ORGANIC SEMICONDUCTOR MATERIAL

The present invention relates to a doped organic semiconductor material and to an organic light-emitting diode (OLED) comprising this semiconductor material.

Since the demonstration of organic light-emitting diodes and solar cells in 1989 [C. W. Tang et al., Appl. Phys. Lett. 51 (12), 913 (1987)], devices which are composed of organic thin layers have formed the subject of intensive research. Such layers have advantageous properties for the aforementioned applications, such as, for example, efficient electroluminescence for organic light-emitting diodes, high absorption coefficients in the range of visible light for organic solar cells, cost-effective preparation of the materials and manufacture of the devices for extremely simple electronic circuits, among others. The use of organic light-emitting diodes for display purposes is already commercially important.

The performance features of (opto)electronic multilayer components are determined inter alia by the ability of the layers to transport the charge carriers. In the case of light-emitting diodes, the ohmic losses in the charge transport layers during operation are closely linked to the conductivity, which on the one hand has a direct influence on the required operating voltage but on the other hand also determines the thermal strain or stress of the component. Moreover, depending on the charge carrier concentration of the organic layers, band bending occurs in the vicinity of a metal contact, which facilitates the injection of charge carriers and can therefore reduce the contact resistance. Similar considerations in respect of organic solar cells also lead to the conclusion that their efficiency is also determined by the transport properties for charge carriers.

By doping hole transport layers with a suitable acceptor material (p-doping) and/or by doping electron transport layers with a donor material (n-doping), the charge carrier density in organic solids (and therefore the conductivity) can be considerably increased. Moreover, by analogy with experience with inorganic semiconductors, applications are to be expected which are based on the use of p- and n-doped layers in a component and which would otherwise not be conceivable. U.S. Pat. No. 5,093,698 describes the use of doped charge carrier transport layers (p-doping of the hole transport layer by adding acceptor-type molecules, n-doping of the electron transport layer by adding donor-type molecules) in organic light-emitting diodes.

To date, the following approaches are known for improving the conductivity of organic layers applied by vapour deposition:
1. Increasing the charge carrier mobility by
   a) using electron transport layers consisting of organic radicals (U.S. Pat. No. 5,811,833),
   b) producing highly organized layers which allow optimal overlapping of the pi orbitals of the molecules,
2. Increasing the density of the movable charge carriers by
   a) cleaning and gently handling the materials in order to prevent the formation of charge carrier traps.
   b) doping organic layers by means of
      aa) inorganic materials (alkali metals: J. Kido et al., U.S. Pat. No. 6,013,384; J. Kido et al., Appl. Phys. Lett. 73, 2866 (1998), oxidation agents such as iodine, $SbCl_5$ etc.)
      bb) organic materials (TNCQ: M. Maitrot et al., J. Appl. Phys., 60 (7), 2396-2400 (1986), F4TCNO: M. Pfeiffer et al., Appl. Phys. Lett., 73 (22), 3202 (1998), BEDT-TTF: A. Nollau et al., J. Appl. Phys., 87 (9), 4340 (2000), naphthalene dicarboxylic acid amide: M. Thomson et al., WO03088271, cationic dyes: A. G. Werner, Appl. Phys. Lett. 82, 4495 (2003)
      cc) organometallic compounds (metallocene: M. Thomson et al., WO03088271)
      dd) metal complexes ($Ru^0(terpy)_3$): K. Harada et al., Phys. Rev. Lett. 94, 036601 (2005)

While there are already sufficiently strong organic dopants for p-doping (F4TCNQ), only inorganic materials such as caesium for example are available for n-doping. By using these, it has already been possible to achieve an improvement in the performance parameters of OLEDs. For example, by doping the hole transport layer with the acceptor material F4TCNQ, a drastic reduction in the operating voltage of the light-emitting diode is achieved (X. Zhou et al., Appl. Phys. Lett., 78 (4), 410 (2001)). A similar success can be achieved by doping the electron transport layer with Cs or Li (J. Kido et al., Appl. Phys. Lett., 73 (20), 2866 (1998); J.-S. Huang et al., Appl. Phys. Lett., 80, 139 (2002)).

For a long time, one significant problem with n-doping lay in the fact that only inorganic materials were available for this. However, the use of inorganic materials has the disadvantage that, due to their small size, the atoms or molecules that are used can easily diffuse into the component and therefore make it more difficult to produce in a defined manner e.g. sharp transitions from p-doped to n-doped areas.

By contrast, when organic molecules which take up a lot of space are used as dopants, diffusion should play a subordinate role since place-changing processes are possible only by overcoming relatively high energy barriers.

Particularly in the case of organic polymeric semiconductor materials, it has been known for many years that effective electron transfer from a dopant (for example sodium) to the organic matrix (for example polyacetylene) is possible only if the difference between the HOMO energy level (=ionization potential) of the dopant and the LUMO energy level (=electron affinity) of the matrix is as small as possible.

For determining the ionization potential, ultraviolet photoelectron spectroscopy (UPS) is the preferred method (e.g. R. Schlaf et al., J. Phys. Chem. B 103, 2984 (1999)). A related method, inverse photoelectron spectroscopy (IPES), is used to determine electron affinities (e.g. W. Gao et al., Appl. Phys. Lett. 82, 4815 (2003)), but this is a less established method. Alternatively, the solid potentials can be estimated by means of electrochemical measurements of oxidation potentials $E_{ox}$ and/or reduction potentials $E_{red}$ in the solution, e.g. by means of cyclic voltammetry (CV) (e.g. J. D. Anderson, J. Amer. Chem. Soc. 120, 9646 (1998)). A number of works provide empirical formulae for converting the electrochemical voltage scale (oxidation potentials) into the physical (absolute) energy scale (ionization potentials), e.g. B. W. Andrade et al., Org. Electron. 6, 11 (2005); T. B. Tang, J. Appl. Phys. 59, 5 (1986); V. D. Parker, J. Amer. Chem. Soc. 96, 5656 (1974); L. L. Miller, J. Org. Chem. 37, 916 (1972); Y. Fu et al., J. Amer. Chem. Soc. 127, 7227 (2005). No correlation between reduction potential and electron affinity is known, since electron affinities can be measured only with difficulty. For the sake of simplicity, therefore, the electrochemical and physical energy scale are converted into one another using $IP=4.8eV+e*E_{ox}$ (vs. ferrocene/ferrocenium) or $EA=4.8\ eV+e*E_{red}$ (vs. ferrocene/ferrocenium), as described in B. W. Andrade, Org. Electron. 6, 11 (2005) (see also Refs. 25-28 therein). The conversion of various standard potentials and redox pairs is described for example in A. J. Bard, L. R. Faulkner, "Electrochemical Methods: Fundamentals and Applications", Wiley, 2nd edition 2000.

It can thus be seen from what has been mentioned above that it is at present impossible to precisely determine all the energy values, and the given values can be considered only as indications.

In the case of n-doping, the dopant acts as electron donor and transfers electrons to a matrix which is characterized by a sufficiently high electron affinity. The matrix is therefore reduced. Due to the transfer of electrons from the n-dopant to the matrix, the charge carrier density of the layer is increased. The extent to which an n-dopant is able to donate electrons to a suitable matrix with electron affinity and thereby increase the charge carrier density and thus also the electrical conductivity depends in turn on the relative situation between the HOMO of the n-dopant and the LUMO of the matrix. If the HOMO of the n-dopant is above the LUMO of the matrix with electron affinity, electron transfer can take place. If the HOMO of the n-dopant is below the LUMO of the matrix with electron affinity, electron transfer can also take place, provided that the energy difference between the two orbitals is small enough to allow a certain thermal population of the higher energy orbital. The smaller this energy difference, the higher the conductivity of the resulting layer should be. However, the highest conductivity is to be expected in the case where the HOMO level of the n-dopant is above the LUMO level of the matrix with electron affinity. The conductivity can in practice be measured and is an indication as to how well the electron transfer from the donor to the acceptor operates, provided that the charge carrier mobilities of different matrices are comparable.

The conductivity of a thin layer sample is measured using the 2-point method. In this method, contacts made of a conductive material, e.g. gold or indium tin oxide, are applied to a substrate. The thin layer to be tested is then applied over the surface of the substrate, so that the contacts are covered by the thin layer. After applying a voltage to the contacts, the current then flowing is measured. Based on the geometry of the contacts and the layer thickness of the sample, the conductivity of the thin layer material is obtained from the resistance thus determined. The 2-point method can be used when the resistance of the thin layer is much greater than the resistance of the supply lines or the contact resistance. In experiments, this is ensured by a sufficiently large spacing between the contacts and can be checked by the linearity of the current/voltage characteristic.

Studies by the inventors have shown that metal complex dopants of the structure IV structure IV can advantageously be used as dopants for an organic matrix material, since such a dopant solves the above-described diffusion problem. For this reason, a dopant having the structure IVa structure IVa = W(hpp)$_4$ was tested as dopant for conventional electron transport materials, such as Alq$_3$ (tris(8-hydroxyquinoline) aluminium) or BPhen (4,7-diphenyl-1,10-phenanthroline).

The gas phase ionization potential of the dopant having the structure IVa is 3.6 eV. The corresponding ionization potential of the solid can be estimated according to Y. Fu et al. (J. Am. Chem. Soc. 2005, 127, 7227-7234) and is approximately 2.5 eV.

The results are shown in Table 1 below.

TABLE 1

CV data, empirically determined LUMO energies and measured conductivities of various electron transport materials (BAlq$_2$ = bis(2-methyl-8-quinolinato)-4-(phenylphenolate) aluminium (III), BPhen = bathophenanthroline, Alq3 = tris (8-hydroxyquinoline) aluminium, Cl6-Alq = tris (5,7-dichloro-8-hydroxyquinoline) aluminium)

| Matrix material | LUMO in eV (determined by CV with Fc/Fc$^+$ as internal standard) | σ (conductivity) in S/cm undoped | σ (conductivity) in S/cm with a doping concentration of 5 mol % |
|---|---|---|---|
| Alq$_3$ | 2.4 | <1E−10 | 9.2E−8 |
| BPhen | 2.42 | <1E−10 | 4E−9 |
| BAlq$_2$ | 2.39 | <1E−10 | 8e−8 |

As can be seen from Table 1, the conductivities achieved with the known matrix materials are still insufficient and very low.

The object of the present invention is to provide a doped organic semiconductor material, which overcomes the disadvantages of the prior art. In particular, a semiconductor material is to be provided which has an increased charge carrier density and effective charge carrier mobility and also an improved conductivity. The semiconductor material is also intended to exhibit a high level of thermal stability, which results for example from higher glass transition points, higher sublimation temperatures and higher decomposition temperatures.

An organic light-emitting diode, for which the semiconductor material according to the invention can be used, is also to be provided.

The object of the invention is achieved by a doped organic semiconductor material comprising at least one organic matrix material, which is doped with at least one dopant, the matrix material being selected from the group consisting of phenanthroline derivatives of the following structures I, II and III:

structure I wherein:
R3 and R6 are independently selected from the group: H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, wherein $R_x$ and $R_y$=$C_1$-$C_{20}$ alkyl, $C_1$-$C_{20}$ alkenyl, $C_1$-$C_{20}$ alkynyl, aryl, heteroaryl, oligoaryl, oligoheteroaryl and oligoarylheteroaryl, wherein all the sp²-hybridized carbon atoms that are not used for ring bonding may be substituted independently of one another with H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, wherein $R_x$ and $R_y$=$C_1$-$C_{20}$ alkyl, $C_1$-$C_{20}$ alkenyl, $C_1$-$C_{20}$ alkynyl; or combinations thereof;

R1, R2, R4, R5, R7 and R8 are not simultaneously hydrogen, but otherwise are independently selected from the group: H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, wherein $R_x$ and $R_y$=$C_1$-$C_{20}$ alkyl, $C_1$-$C_{20}$ alkenyl, $C_1$-$C_{20}$ alkynyl, aryl, heteroaryl, oligoaryl, oligoheteroaryl and oligoarylheteroaryl, wherein all the sp²-hybridized carbon atoms that are not used for ring bonding may be substituted independently of one another with H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, wherein $R_x$ and $R_y$=$C_1$-$C_{20}$ alkyl, $C_1$-$C_{20}$ alkenyl, $C_1$-$C_{20}$ alkynyl; or combinations thereof;

structure II wherein structure II is a dimer in which two phenanthroline units are bonded to one another via a single bond, and on each phenanthroline unit independently this bond can be located at the 2, 3, 4, 5, 6, 7, 8 or 9 position of the respective phenanthroline ring, wherein
the substituents R2, R3, R4, R5, R6, R7 and R8 are not simultaneously hydrogen, but otherwise are independently selected from the group: H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, wherein $R_x$ and $R_y$=$C_1$-$C_{20}$ alkyl, $C_1$-$C_{20}$ alkenyl, $C_1$-$C_{20}$ alkynyl, aryl, heteroaryl, oligoaryl, oligoheteroaryl and oligoarylheteroaryl, wherein all the sp²-hybridized carbon atoms which are not used for ring bonding may be substituted independently of one another with H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, wherein $R_x$ and $R_y$=$C_1$-$C_{20}$ alkyl, $C_1$-$C_{20}$ alkenyl, $C_1$-$C_{20}$ alkynyl; or combinations thereof;

structure III wherein X is bonded to each phenanthroline unit via a single bond, and on each phenanthroline unit independently this bond can be located at the 2, 3, 4, 5, 6, 7, 8 or 9 position of the respective phenanthroline ring, wherein X is a central element which is selected from the group B, C, Si, Ge, Sn, N, O, S, P, wherein n is an integer between 1 and the maximum valency of the selected central element, or wherein X is a central structural unit, which may be a simple or bridged cycloalkane, an aromatic, a heteroaromatic, or a spiro-bonded polycyclic system, and n is an integer between 1 and the maximum number of phenanthroline units, wherein
the substituents R2, R3, R4, R5, R6, R7 and R8 are not simultaneously hydrogen, but otherwise are independently selected from the group: H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, wherein $R_x$ and $R_y$=$C_1$-$C_{20}$ alkyl, $C_1$-$C_{20}$ alkenyl, $C_1$-$C_{20}$ alkynyl, aryl, heteroaryl, oligoaryl, oligoheteroaryl and oligoarylheteroaryl, wherein all the sp²-hybridized carbon atoms which are not used for ring bonding may be substituted independently of one another with H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, wherein $R_x$ and $R_y$=$C_1$-$C_{20}$ alkyl, $C_1$-$C_{20}$ alkenyl, $C_1$-$C_{20}$ alkynyl; or combinations thereof.

In relation to structure II illustrated above, it must be noted that the bonding shown therein is given solely by way of example. The bonding of the two phenanthroline units may take place independently of one another via any position of the respective phenanthroline ring, i.e. the 2, 3, 4, 5, 6, 7, 8 or 9 position. Structure II as illustrated above shows by way of example a bonding of two phenanthroline units in which a bond is produced in each case via an external ring element, and in each case the radical $R_1$ (1st structure I) has been removed for the bond. The same also applies in respect of structure III shown above, in which a bond between X and the phenanthroline unit is possible via any suitable position, i.e. the 2, 3, 4, 5, 6, 7, 8 or 9 position, of the phenanthroline unit.

If n in structure III does not correspond to the maximum valency, one or more radicals $R_0$ for X can be selected from $R_1$-$R_8$, as defined above.

As the central structural unit X, mention may be made for example of adamantane or spirobifluorene.

It is preferred that the matrix material can be reversibly reduced.

Alternatively, it is proposed that, during a reduction, the matrix material breaks down into stable, redox-inactive constituents.

The dopant may be a metal complex.

Preferably, the metal complex has a structure IV:

structure IV wherein M is a transition metal, preferably Mo or W; and wherein the structural elements a-f can have the following meaning:
a=—$CR_9R_{10}$—, b=—$CR_{11}R_{12}$—, c=—$CR_{13}R_{14}$—, d=$R_{15}R_{16}$—, e=—$CR_{17}R_{18}$— and f=—$CR_{19}R_{20}$—, wherein $R_9$-$R_{20}$ independently of one another are hydrogen, $C_1$-$C_{20}$ alkyl, $C_1$-$C_{20}$ cycloalkyl, $C_1$-$C_{20}$ alkenyl, $C_1$-$C_{20}$ alkynyl, aryl, heteroaryl, —NRR or —OR, wherein R=$C_1$-$C_{20}$ alkyl, $C_1$-$C_{20}$ cycloalkyl, $C_1$-$C_{20}$ alkenyl, $C_1$-$C_{20}$ alkynyl, aryl or heteroaryl, wherein preferably $R_9$, $R_{11}$, $R_{13}$, $R_{15}$, $R_{17}$, $R_{19}$=H and $R_{10}$, $R_{12}$, $R_{14}$, $R_{16}$, $R_{18}$, $R_{20}$=$C_1$-$C_{20}$ alkyl, $C_1$-$C_{20}$ cycloalkyl, $C_1$-$C_{20}$ alkenyl, $C_1$-$C_{20}$ alkynyl, aryl, heteroaryl, —NRR or —OR, or in the case of structural elements c and/or d, C can be replaced by Si, or optionally a or b or e or f is NR, with R=$C_1$-$C_{20}$ alkyl, $C_1$-$C_{20}$ cycloalkyl, $C_1$-$C_{20}$ alkenyl, $C_1$-$C_{20}$ alkynyl, aryl, heteroaryl, or optionally a and f or b and e are NR, with R=$C_1$-$C_{20}$ alkyl, $C_1$-$C_{20}$ cycloalkyl, $C_1$-$C_{20}$ alkenyl, $C_1$-$C_{20}$ alkynyl, aryl, heteroaryl, wherein the bonds a-c, b-d, c-e and d-f, but not simultaneously a-c and c-e and not simultaneously b-d and d-f, may be unsaturated, wherein the bonds a-c, b-d, c-e and d-f may be part of a saturated or unsaturated ring system, which may also contain the heteroelements O, S, Se, N, P, Se, Ge, Sn, or the bonds a-c, b-d, c-e and d-f are part of an aromatic or condensed aromatic ring system, which may also contain the heteroelements O, S, Si, N, wherein the atom E is a main group element, preferably selected from the group C, N, P, As, Sb, wherein the structural element a-E-b is optionally part of a saturated or unsaturated ring system, which may also contain the heteroelements O, S, Se, N, P, Si, Ge, Sn, or the structural element a-E-b is optionally part of an aromatic ring system, which may also contain the heteroelements O, S, Se, N.

It is particularly preferred if the dopant has the following structure IVa:

structure IVa = W(hpp)$_4$

As an alternative, it is also preferred if the dopant is an alkali metal and/or alkaline earth metal, preferably caesium.

It is also proposed that the matrix material has an energy level for the lowest unoccupied molecular orbital (LUMO), which differs by 0-0.5 V from the ionization potential (HOMO) of the dopant, preferably by 0-0.3 V, particularly preferably by 0-0.15V.

One embodiment is characterized in that the matrix material has an electron affinity (LUMO energy level), which is lower than the ionization potential (HOMO) of the dopant. Here, "lower" means that the LUMO energy level has a greater numerical value than the HOMO energy level. Since the two parameters are given negatively from the vacuum level, this means that the absolute HOMO energy value is greater than the absolute LUMO energy value.

It is also preferred if the concentration of the dopant is 0.5 to 25 percent by mass, preferably 1 to 10 percent by mass, particularly preferably 2.5 to 5 percent by mass.

It may furthermore be provided that the glass transition temperature Tg of the matrix material is higher than that of 4,7-diphenyl-1,10-phenanthroline.

Preferably, the matrix material has an evaporation temperature of at least 200° C.

The invention also provides an organic light-emitting diode, which comprises a semiconductor material according to the invention.

It has surprisingly been found that certain phenanthroline derivatives can be used as matrix materials which can if necessary be doped with metal complex dopants. By incorporating suitable electron-attracting substituents at certain positions in the phenanthroline skeleton, electronic properties of the semiconductor material can be set in a targeted manner, so that the LUMO of the phenanthroline derivate falls within a range which means that it can be doped with metal complex dopants, in particular having the structure IV.

Up to date, phenanthroline derivatives have been used for example as undoped electron conductors (EP 0 564 224 A2) or hole blockers (EP 1 097 981, EP 1 097 980). The phenanthroline derivative BPhen has also already been used as a caesium-doped layer in organic light-emitting diodes (U.S. Pat. No. 6,013,384), but with the aforementioned disadvantage of diffusion of the metal when a voltage is applied, which leads to premature failure of the light-emitting diode.

The matrix materials used according to the invention for the semiconductor material moreover have an improved level of thermal stability compared to the prior art, which can be attributed in particular to increased sublimation and decomposition temperatures. The efficiency of an OLED according to the invention is also increased.

Further features and advantages of the invention will become apparent from the following detailed description of preferred examples of embodiments, with reference to the appended drawings, in which.

EXAMPLE 1

Selected phenanthroline derivatives, which are shown in Table 2 below, were used as matrix material for doping with $W_2(hpp)_4$ (structure IVa), and the conductivity was measured. The results are summarized in Table 2.

TABLE 2 structure I

| R | | Tg (°C.) | Ts (°C.) | LUMO (eV) | Conductivity (S/cm)* |
|---|---|---|---|---|---|
| Ia | R2, R4, R5, R7 = H<br>R1, R3, R6, R8 = phenyl | 106 | 260 | 2.47 | 3E-4 |
| Ib | R2, R4, R5, R7, R8 = H<br>R3, R6 = phenyl<br>R1 = 1-naphthyl | 104 | 265 | 2.42 | 5E-6 |
| Ic | R2, R4, R5, R7 = H<br>R3, R6 = phenyl<br>R1, R8 = naphthyl | 119 | 280 | 2.5 | 2E-6 |
| Id | R2, R4, R5, R7 = H<br>R3, R6 = phenyl<br>R1, R8 = 1-(4,4'-biphenylyl) | 140 | 317 | 2.53 | 6E-5 |
| Ie | R2, R4, R5, R7 = H<br>R3, R6 = phenyl<br>R1, R8 = 1-phenanthryl | 165 | 317 | 2.51 | 2E-6 |

*Concentration IVa ($W_2(hpp)_4$): 5 mol %

Comparison with the conductivity values for the matrix materials $Alq_3$ and BPhen known from the prior art (Table 1) shows considerably improved conductivity values for the phenanthroline derivatives used according to the invention.

EXAMPLE 2

Figure 1:
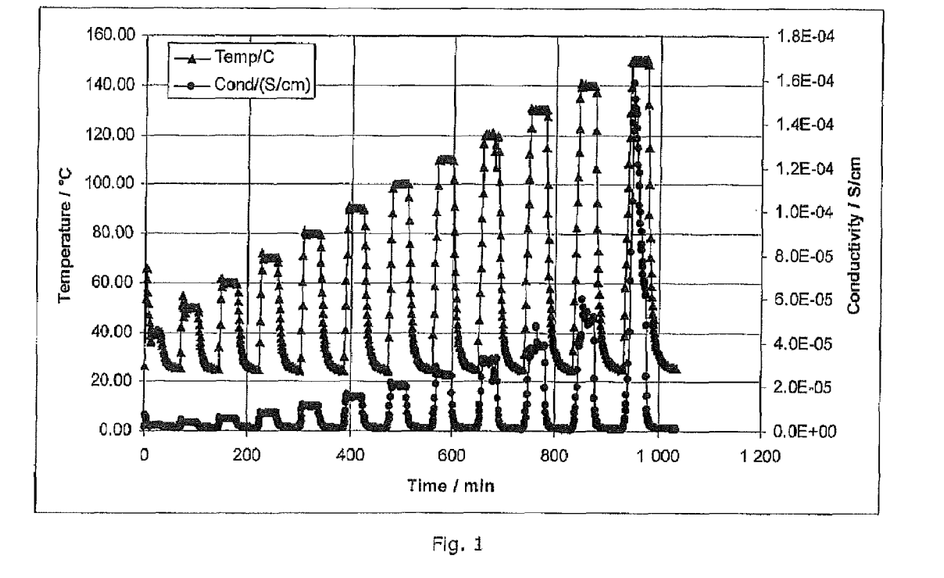
FIG. 1 shows a graph which illustrates the dependence of the conductivity on temperature for a semiconductor material produced according to Example 2.

A glass substrate is provided with contacts made of indium tin oxide. A layer of Ie (Table 2) doped with a dopant of structure IVa is then produced on the substrate. The doping concentration of the dopant IVa is 4 mol %. The conductivity of the layer is $2*10^{-6}$ S/cm at room temperature. The sample is then subjected to a temperature cycle. The temperature cycle consists of individual steps. In each step, the sample is heated to the target temperature, held at the target temperature for 20 min and then cooled to room temperature. Successive steps differ in that the target temperature is increased by 10° C. in each case. During the temperature cycle, the conductivity of the layer is measured. The results are shown in FIG. 1. It was found that the conductivity of the hybrid layer consisting of Ie and IVa is temperature-stable up to 140° C. Only from 150° C. onwards does the conductivity drop considerably during the 20 minute holding time.

COMPARATIVE EXAMPLE 2

Comparative Example 2 was carried out in a manner analogous to the procedure according to Example 2, but BPhen was used instead of the matrix material Ie. The resulting conductivity of the layer is $4*10^{-7}$ S/cm. As can be seen from FIG. 2, such a semiconductor material is stable only up to a temperature of 70° C.

Figure 2:
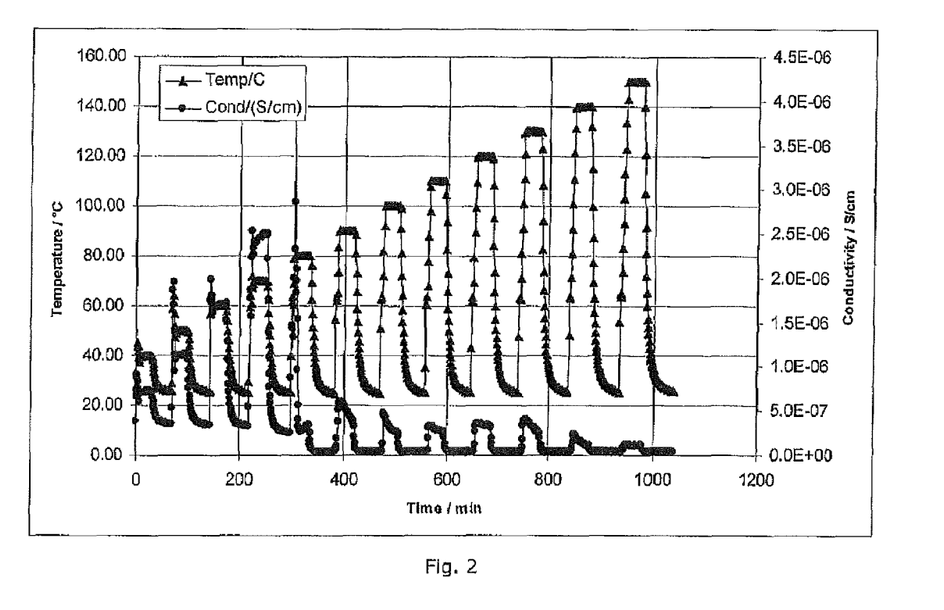
FIG. 2 shows a graph which illustrates the temperature-dependence of the conductivity for a semiconductor material produced according to Comparative Example 2.

By comparing FIGS. 1 and 2, it can be seen that the conductivity of a semiconductor material consisting of IVa:BPhen is too low for use in organic light-emitting diodes. When using the matrix material Ie, the conductivity is increased by a factor of 5 and the temperature stability is 70° C. higher.

EXAMPLE 3

A glass substrate is provided with contacts made of indium tin oxide. The layers spiro-TTB doped with p-dopant 2-(6-dicyanomethylene-1,3,4,5,7,8-hexafluoro -6H-naphthalen-2-ylidene)malononitrile (50 nm, 4 mol %), 2,2',7,7'-tetrakis (N,N'-diphenylamino)-9,9'-spirobifluorene, N,N'-di (naphthalen-2-yl)-N,N'-diphenylbenzidine doped with emitter dopant iridium(III)bis(2-methyldibenzo[f,h]quinoxaline)-(acetylacetonate) (20 nm, 10% by weight), Id (10 nm), Id doped with IVa (60 nm, 4 mol %)/Al (100 nm) are then deposited thereon one after the other. The organic light-emitting diode thus produced emits orange-red light.

The organic light-emitting diode (OLED) is subjected to a stability test. For this test, the OLED is encapsulated and operated at 80° C. in an oven. The decrease in brightness over time at a constant current density is measured.

Figure 3:
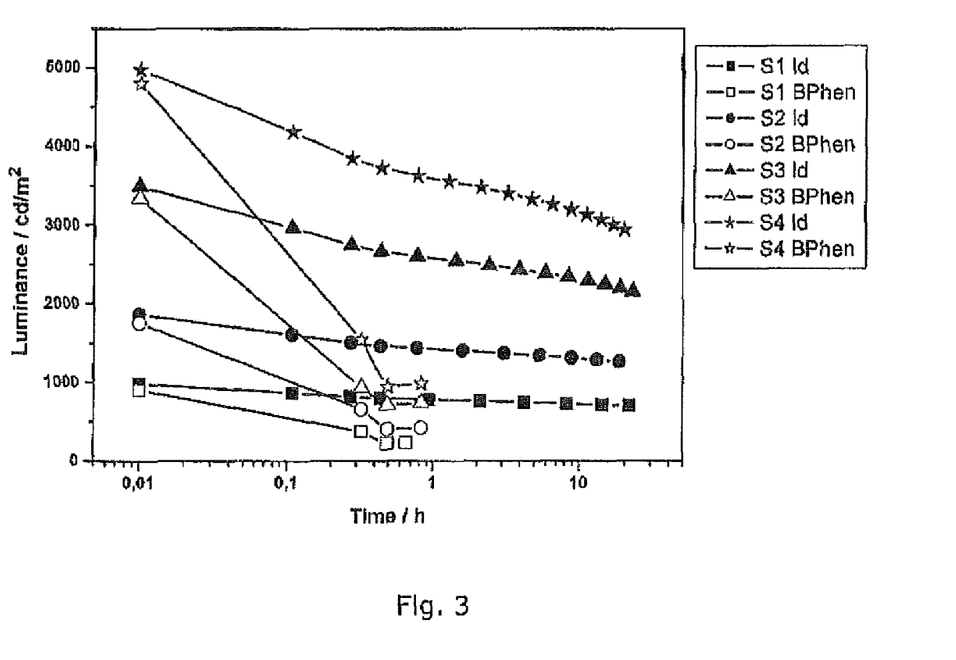
FIG. 3 shows a graph which illustrates the time-dependence of the brightness of OLEDs comprising various semiconductor materials according to the invention and the prior art.

After 10 hours, the OLED exhibits a decrease in luminance from for example 5000 cd/m² to 3300 cd/m², as can be seen from the filled-in symbols shown in FIG. 3. The decrease in luminance of OLEDs having the same structure with lower starting brightnesses is shown by the three further curves with filled-in symbols in FIG. 3. The open symbols show the stability of the OLED according to Comparative Example 3.

COMPARATIVE EXAMPLE 3

An OLED was produced as in Example 3, but BPhen was used instead of Id. The decrease in luminance for this OLED during continuous operation is also shown in FIG. 3 by open symbols. After less than one hour, the brightness has decreased from 4800 cd/m² to less than 1000 cd/m². The fact that similar starting brightnesses have been selected for OLEDs according to the structure of Comparative Example 3 and Example 3 allows direct comparison of the stability of the two structures. The OLED using Id as matrix material is therefore more stable than the OLED using doped BPhen.

The features disclosed in the description, the claims and the appended drawings may be essential both individually and in any combination with one another for implementing the invention in its various embodiments.

The claims are as follow:

1. Doped organic semiconductor material comprising at least one organic matrix material, which is doped with at least one dopant, the matrix material being selected from the group consisting of phenanthroline derivatives of the following structure I:

structure I wherein:

R3 and R6 are aryl;

R1 and R8 are independently selected from the group consisting of H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, —$SO_2R_x$, aryl, heteroaryl, oligoaryl, oligoheteroaryl, and oligoarylheteroaryl, wherein $R_x$ and $R_y$ are independently selected from the group consisting of $C_1$-$C_{20}$ alkyl, $C_1$-$C_{20}$ alkenyl, and $C_1$-$C_{20}$ alkynyl; wherein all the $sp^2$-hybridized carbon atoms that are not used for ring bonding may be substituted independently of one another with H, $C_1$-$C_{20}$ alkyl, $C_1$-$C_{20}$ alkenyl, $C_1$-$C_{20}$ alkynyl, alkyloxy —$OR_x$, dialkylamino —$NR_xR_y$, alkylthio —$SR_x$, —$NO_2$, —CHO, —$COOR_x$, —F, —Cl, —Br, —I, —CN, —NC, —SCN, —OCN, —$SOR_x$, or —$SO_2R_x$, wherein $R_x$ and $R_y$ are independently selected from $C_1$-$C_{20}$ alkyl, $C_1$-$C_{20}$ alkenyl, or $C_1$-$C_{20}$ alkynyl; and wherein at least one of R1 and R8 is aryl; and wherein R2, R4, R5, and R7 are hydrogen; wherein the dopant is a metal complex.

2. Semiconductor material according to claim 1, wherein the matrix material can be reversibly reduced.

3. Semiconductor material according to claim 1, wherein, upon reduction, the matrix material breaks down into stable, redox-inactive constituents.

4. Semiconductor material according to claim 1, wherein the metal complex has a structure IV:

structure IV wherein M is a transition metal; and wherein
a is —$CR_9R_{10}$—, b is —$CR_{11}R_{12}$—, c is —$CR_{13}R_{14}$— or —$SiR_{13}R_{14}$—, d is —$CR_{15}R_{16}$— or —$SiR_{15}R_{16}$—, e is —$CR_{17}R_{18}$— and f is —$CR_{19}R_{20}$—, wherein $R_9$-$R_{20}$ independently of one another are selected from the group consisting of hydrogen, $C_1$-$C_{20}$ alkyl, $C_1$-$C_{20}$ cycoalkyl, $C_1$-$C_{20}$ alkenyl, $C_1$-$C_{20}$ alkynyl, aryl, heteroaryl, —NRR and —OR, wherein R is selected from the group consisting of $C_1$-$C_{20}$ alkyl, $C_1$-$C_{20}$ cycoalkyl, $C_1$-$C_{20}$ alkenyl, $C_1$-$C_{20}$ alkynyl, aryl, and heteroaryl; and
wherein the atom E is a main group element.

5. The semiconductor material according to claim 4, wherein the bonds a-c, b-d, c-e, and d-f, but not simultaneously a-c and c-e, and not simultaneously b-d and d-f, are unsaturated.

6. The semiconductor material according to claim 4, wherein the bonds a-c, b-d, c-e, and d-f comprise part of a saturated or unsaturated ring system.

7. The semiconductor material according to claim 6, wherein the saturated or unsaturated ring system comprises at least one heteroelement selected from the group consisting of O, S, Se, N, P, Se, Ge, and Sn.

8. The semiconductor material according to claim 4, wherein the bonds a-c, b-d, c-e, and d-f comprise part of an aromatic or condensed aromatic ring system.

9. The semiconductor material according to claim 8, wherein the aromatic or condensed aromatic ring system comprises at least one heteroelement selected from the group consisting of O, S, Si, and N.

10. The semiconductor material according to claim 4, wherein the structural element a-E-b comprises part of a saturated or unsaturated ring system.

11. The semiconductor material according to claim 10, wherein the saturated or unsaturated ring system comprises at least one heteroelement selected from the group consisting of O, S, Se, N, P, Si, Ge, and Sn.

12. The semiconductor material according to claim 4, wherein the structural element a-E-b comprises part of an aromatic ring system.

13. The semiconductor material according to claim 12, wherein the aromatic ring system comprises at least one heteroelement selected from the group consisting of O, S, Se, and N.

14. The semiconductor material according to claim 4, wherein a or b or e or f is NR, wherein R is selected from the group consisting of $C_1$-$C_{20}$ alkyl, $C_1$-$C_{20}$ cycloalkyl, $C_1$-$C_{20}$ alkenyl, $C_1$-$C_{20}$ alkynyl, aryl, and heteroaryl.

15. The semiconductor material according to claim 4, wherein a and f, or b and e are NR, wherein R is selected from the group consisting of $C_1$-$C_{20}$ alkyl, $C_1$-$C_{20}$ cycloalkyl, $C_1$-$C_{20}$ alkenyl, $C_1$-$C_{20}$ alkynyl, aryl, and heteroaryl.

16. The semiconductor material according to claim 4, wherein M is Mo or W.

17. The semiconductor material according to claim 4, wherein $R_9$, $R_{11}$, $R_{13}$, $R_{15}$, $R_{17}$, $R_{19}$ are H; and $R_{10}$, $R_{12}$, $R_{14}$, $R_{16}$, $R_{18}$, $R_{20}$ are selected from the group consisting of $C_1$-$C_{20}$ alkyl, $C_1$-$C_{20}$ cycloalkyl, $C_1$-$C_{20}$ alkenyl, $C_1$-$C_{20}$ alkynyl, aryl, heteroaryl, —NRR, and —OR.

18. The semiconductor material according to claim 4, wherein E is selected from the group consisting of C, N, P, As, and Sb.

19. Semiconductor material according to claim 4, wherein the dopant has the following structure IVa:

structure IVa

20. Semiconductor material according to claim 1, wherein the matrix material has an energy level for the lowest unoccupied molecular orbital (LUMO), which differs by about 0 to about 0.5 V from the ionization potential (HOMO) of the dopant.

21. The semiconductor material according to claim 20, wherein energy level for the lowest unoccupied molecular orbital (LUMO) differs by about 0 to about 0.3 V from the ionization potential (HOMO) of the dopant.

22. The semiconductor material according to claim 20, wherein energy level for the lowest unoccupied molecular orbital (LUNO) differs by about 0 to about 0.15 V from the ionization potential (HOMO) of the dopant.

23. Semiconductor material according to claim 1, wherein the matrix material has a LUMO energy level, which is lower than the ionization potential (HOMO) of the dopant.

24. Semiconductor material according to claim 1, wherein the concentration of the dopant is about 0.5 to about 25 percent by mass.

25. The semiconductor material according to claim 24, wherein the concentration of the dopant is about 1 to about 10 percent by mass.

26. The semiconductor material according to claim 24, wherein the concentration of dopant is about 2.5 to about 5 percent by mass.

27. Semiconductor material according to claim 1, wherein the glass transition temperature $T_g$ of the matrix material is higher than that of 4,7-diphenyl-1,10-phenanthroline.

28. Semiconductor material according to claim 1, wherein the matrix material has an evaporation temperature of at least 200° C.

29. Organic light-emitting diode, which comprises a semiconductor material according to claim 1.

* * * * *